United States Patent
Basceri et al.

(10) Patent No.: US 7,488,514 B2
(45) Date of Patent: *Feb. 10, 2009

(54) METHODS OF FORMING BARIUM STRONTIUM TITANATE LAYERS

(75) Inventors: Cem Basceri, Boise, ID (US); Nancy Alzola, Boise, ID (US)

(73) Assignee: Micron Technology, Inc., Boise, ID (US)

(*) Notice: Subject to any disclaimer, the term of this patent is extended or adjusted under 35 U.S.C. 154(b) by 585 days.

This patent is subject to a terminal disclaimer.

(21) Appl. No.: 11/028,956

(22) Filed: Jan. 3, 2005

(65) Prior Publication Data

US 2005/0133127 A1 Jun. 23, 2005

Related U.S. Application Data

(63) Continuation of application No. 09/905,286, filed on Jul. 13, 2001, now Pat. No. 6,838,122.

(51) Int. Cl.
  *C23C 16/40* (2006.01)
(52) U.S. Cl. .................. 427/255.32; 427/255.36; 438/3; 438/763; 438/785
(58) Field of Classification Search ............ 427/255.36, 427/255.32, 255.26; 438/3, 763, 785
See application file for complete search history.

(56) References Cited

U.S. PATENT DOCUMENTS

| 4,105,810 | A | 8/1978 | Yamazaki et al. |
| 4,261,698 | A | 4/1981 | Carr et al. |
| 4,691,662 | A | 9/1987 | Roppel et al. |
| 5,006,363 | A | 4/1991 | Fujii et al. |
| 5,164,363 | A | 11/1992 | Eguchi et al. |
| 5,183,510 | A | 2/1993 | Kimura |

(Continued)

FOREIGN PATENT DOCUMENTS

EP 0 030 798 A1 6/1981

(Continued)

OTHER PUBLICATIONS

Aoyama et al., *Leakage Current Mechanism of Amorphous and Polycrystalline $Ta_2O_5$ Films Grown by Chemical Vapor Deposition*, 143 J. Electrochem Soc., No. 3, pp. 977-983 (Mar. 1996).

(Continued)

*Primary Examiner*—Bret Chen
(74) *Attorney, Agent, or Firm*—Wells St. John P.S.

(57) ABSTRACT

A chemical vapor deposition method of forming a barium strontium titanate comprising dielectric layer. A substrate is positioned within a reactor. Barium and strontium are provided within the reactor by flowing at least one metal organic precursor to the reactor. Titanium is provided within the reactor. At least one oxidizer is flowed to the reactor under conditions effective to deposit a barium strontium titanate comprising dielectric layer on the substrate. In one implementation, the oxidizer comprises $H_2O$. In one implementation, the oxidizer comprises $H_2O_2$. In one implementation, the oxidizer comprises at least $H_2O$ and at least another oxidizer selected from the group consisting of $O_2$, $O_3$, $NO_x$, $N_2O$, and $H_2O_2$, where "x" is at least 1. In one implementation, the oxidizer comprises at least $H_2O_2$ and at least another oxidizer selected from the group consisting of $O_2$, $O_3$, $NO_x$, and $N_2O$, where "x" is at least 1.

25 Claims, 2 Drawing Sheets

U.S. PATENT DOCUMENTS

| | | |
|---|---|---|
| 5,254,505 A | 10/1993 | Kamiyama |
| 5,256,455 A | 10/1993 | Numasawa |
| 5,261,961 A | 11/1993 | Takasu et al. |
| 5,270,241 A | 12/1993 | Dennison et al. |
| 5,312,783 A | 5/1994 | Takasaki et al. |
| 5,392,189 A | 2/1995 | Fazan et al. |
| 5,395,771 A | 3/1995 | Nakato |
| 5,459,635 A | 10/1995 | Tomozawa et al. |
| 5,468,687 A | 11/1995 | Carl et al. |
| 5,470,398 A | 11/1995 | Shibuya et al. |
| 5,525,156 A | 6/1996 | Manada et al. |
| 5,596,214 A | 1/1997 | Endo |
| 5,614,018 A | 3/1997 | Azuma et al. |
| 5,618,761 A | 4/1997 | Eguchi et al. |
| 5,635,741 A | 6/1997 | Tsu et al. |
| 5,656,329 A | 8/1997 | Hampden-Smith |
| 5,663,089 A | 9/1997 | Tomozawa et al. |
| 5,702,562 A | 12/1997 | Wakahara |
| 5,711,816 A | 1/1998 | Kirlin et al. |
| 5,719,417 A | 2/1998 | Roeder et al. |
| 5,723,361 A | 3/1998 | Azuma et al. |
| 5,731,948 A | 3/1998 | Yializis et al. |
| 5,736,759 A | 4/1998 | Haushalter |
| 5,776,254 A | 7/1998 | Yuuki et al. |
| 5,783,253 A | 7/1998 | Roh |
| 5,798,903 A | 8/1998 | Dhote et al. |
| 5,834,060 A | 11/1998 | Kawahara et al. |
| 5,909,043 A | 6/1999 | Summerfelt |
| 5,972,430 A | 10/1999 | DiMeo, Jr. et al. |
| 5,976,990 A | 11/1999 | Mercaldi et al. |
| 5,989,927 A | 11/1999 | Yamonobe |
| 6,025,222 A | 2/2000 | Kimura et al. |
| 6,037,205 A | 3/2000 | Huh et al. |
| 6,043,526 A | 3/2000 | Ochiai |
| 6,046,345 A | 4/2000 | Kadokura et al. |
| 6,078,492 A | 6/2000 | Huang et al. |
| 6,090,443 A | 7/2000 | Eastep |
| 6,101,085 A | 8/2000 | Kawahara et al. |
| 6,126,753 A | 10/2000 | Shinriki et al. |
| 6,127,218 A | 10/2000 | Kang |
| 6,143,597 A | 11/2000 | Matsuda et al. |
| 6,143,679 A | 11/2000 | Nagasawa |
| 6,146,907 A | 11/2000 | Xiang et al. |
| 6,150,684 A | 11/2000 | Sone |
| 6,153,898 A | 11/2000 | Watanabe |
| 6,156,638 A | 12/2000 | Agarwal et al. |
| 6,165,834 A | 12/2000 | Agarwal et al. |
| 6,211,096 B1 | 4/2001 | Allman |
| 6,215,650 B1 | 4/2001 | Gnade et al. |
| 6,236,076 B1 | 5/2001 | Arita et al. |
| 6,238,734 B1 | 5/2001 | Senzaka et al. |
| 6,245,652 B1 | 6/2001 | Gardner et al. |
| 6,258,170 B1 | 7/2001 | Somekh |
| 6,258,654 B1 | 7/2001 | Gocho |
| 6,277,436 B1 | 8/2001 | Stauf et al. |
| 6,285,051 B1 | 9/2001 | Ueda et al. |
| 6,287,935 B1 | 9/2001 | Coursey |
| 6,323,057 B1 | 11/2001 | Sone |
| 6,325,017 B1 | 12/2001 | DeBoer et al. |
| 6,335,049 B1 | 1/2002 | Basceri |
| 6,335,302 B1 | 1/2002 | Satoh |
| 6,337,496 B2 | 1/2002 | Jung |
| 6,338,970 B1 | 1/2002 | Suh |
| 6,362,068 B1 | 3/2002 | Summerfelt |
| 6,372,686 B1 | 4/2002 | Golden |
| 6,422,281 B1 | 7/2002 | Ensign, Jr. et al. |
| 6,500,487 B1 | 12/2002 | Holst et al. |
| 6,507,060 B2 | 1/2003 | Ren et al. |
| 6,527,028 B2 | 3/2003 | Miller |
| 6,558,517 B2 | 5/2003 | Basceri |
| 6,566,147 B2 * | 5/2003 | Basceri et al. ............ 438/3 |
| 6,602,376 B1 | 8/2003 | Bradshaw |
| 6,727,140 B2 | 4/2004 | Basceri et al. |
| 6,838,122 B2 * | 1/2005 | Basceri et al. ......... 427/255.36 |
| 6,838,293 B2 * | 1/2005 | Basceri et al. ................ 438/3 |
| 6,878,602 B2 | 4/2005 | Basceri et al. |
| 6,884,475 B2 | 4/2005 | Basceri |
| 6,908,639 B2 | 6/2005 | Basceri et al. |
| 6,952,029 B1 | 10/2005 | Basceri |
| 6,962,824 B2 * | 11/2005 | Basceri et al. ................ 438/3 |
| 6,982,103 B2 | 1/2006 | Basceri et al. |
| 6,995,419 B2 | 2/2006 | Agarwal et al. |
| 7,005,695 B1 | 2/2006 | Agarwal |
| 7,011,978 B2 | 3/2006 | Basceri |
| 7,023,043 B2 | 4/2006 | Basceri et al. |
| 7,029,985 B2 | 4/2006 | Basceri et al. |
| 7,038,263 B2 * | 5/2006 | Yang et al. ................ 257/295 |
| 7,052,584 B2 | 5/2006 | Basceri |
| 7,073,730 B2 | 7/2006 | Haag et al. |
| 7,208,198 B2 | 4/2007 | Basceri et al. |
| 2002/0132374 A1 * | 9/2002 | Basceri et al. ................ 438/3 |
| 2002/0197793 A1 | 12/2002 | Dornfest et al. |
| 2003/0017266 A1 | 1/2003 | Basceri et al. |
| 2003/0045006 A1 | 3/2003 | Basceri |

FOREIGN PATENT DOCUMENTS

| | | |
|---|---|---|
| EP | 0 306 069 A2 | 3/1989 |
| EP | 0 388 957 A2 | 9/1990 |
| EP | 0 474 140 A1 | 3/1992 |
| EP | 0 474 140 B1 | 3/1992 |
| EP | 0 810 666 A1 | 12/1997 |
| EP | 0 835 950 A1 | 4/1998 |
| EP | 0 855 735 A2 | 7/1998 |
| EP | 0 892 426 A2 | 1/1999 |
| EP | 0 957 522 A2 | 11/1999 |
| GB | 2 194 555 A | 3/1988 |
| JP | 2250970 | 10/1990 |
| JP | 04-024922 | 1/1992 |
| JP | 04-115533 | 4/1992 |
| JP | 04-180566 | 6/1992 |
| JP | 08-060347 | 3/1996 |
| JP | 2000091333 A | 3/2000 |
| WO | WO 98/39497 | 9/1998 |
| WO | WO 99/64645 | 12/1999 |
| WO | WO 01/16395 A1 | 3/2001 |

OTHER PUBLICATIONS

Arai et al., *Preparation of SrTiO₃ Films on 8-Inch Wafers by Chemical Vapor Deposition*, 35 Jpn. J. Appl. Phys. 4875-4870 (1996).

Dissertation: Cem Basceri, *Electrical and Dielectric Properties of (Ba,Sr)TiO₃ Thin Film Capacitors for Untra High Density Dynamic Random Access . . .* , North Carolina State University, 171 pages (1997).

Basceri et al., *The dielectric response as a function of temperature and film thickness of fiber-textured (Ba,Sr)TiO₃ thin films grown by chemical vapor . . .* , 82 J. Appl. Phys., No. 5, pp. 2497-2504 (Sep. 1, 1997).

Bilodeau et al., *Composition Dependence of the Dielectric Properties of MOCVD Ba$_x$Sr$_{1-2}$TiO$_3$*, pp. 1-21 (MRS Fall Meeting Dec. 1, 1994).

Bilodeau et al., *MOCVD BST for High Density DRAM Applications*, 2 pages (pre-print for Semicon/West Jul. 12, 1995).

Abstract: Choi et al., *Improvements of the Properties of Chemical-Vapor-Deposited(Ba,Sr)TiO₃ Films through Use of a Seed Layer*, 36 Jpn. J. Appl. Phys., Pt. 1, No. 11, pp. 6824-6828 (1997).

Abstract: Chu et al., *Electrical properties and crystal structure of (Ba,Sr)TiO₃ films prepared at low temperatures on a LaNIO₃ electrode by radio- . . .* , 70 Appl. Phys. Lett., No. 2, pp. 249-251 (1997).

Abstract:: Eguchi et al., *Chemical vapor deposition of (Ba,Sr)TiO₃ thin films for application in gigabit scale dynamic random access memories*, 14 Integrated Ferroelectrics Pt. 1, Nos. 1-4, pp. 33-42 (1997).

Abstract: Jia et al., *Structural and dielectric properties of $Ba_{0.5}Sr_{0.5}TiO_3$ thin films with an epi-$RuO_2$ bottom electrode*, 19 Integrated Ferroelectrics Nos. 1-4, pp. 111-119 (1998).

Kawahara et al. *(Ba,Sr)$TiO_3$ Films Prepared by Liquid Source Chemical Vapor Deposition on Ru Electrodes*, 35 Jpn. J. Appl. Phys., Pt. 1, No. 9B, pp. 4882-4883 (Sep. 1996).

Khamankar et al., *A Novel Low-Temperature Process for High Dielectric Constant BST Thin Films for ULSI DRAM . . .* , Microelectronics Research Center, Univ. of Texas at Austin, TX , 2 pages (pre-May 2000).

Kim et al., *Advantages of $RuO_x$ bottom electrode in the dielectric and leakage characteristics of (Ba,Sr)$TiO_3$ capacitor*, 35 Jpn. J. Appl. Phys., Pt. 1, No. 12A, pp. 6153-6156 (1996).

Kim et al., *Structural and electrical properties of $BaTiO_3$ grown on p-InP (100) by low-pressure metalorganic chemical . . .* , 320 Appl. Phys. Lett. No. 15, pp. 1955-1956 (Oct. 1994).

Abstract: Paek et al., *Characterization of MIS capacitor of BST thin films deposited on Si by RF magnetron . . .* , Ferroelectric Thin Films V. Synposium, San Francisco, CA, pp. 33-38 (Apr. 7, 1995).

Stemmer et al., *Accomodation of nonstoichiometry in (100) fiber-textured $(Ba_xSr_{1-x})Ti_{1+y}O_{3+Z}$ thin films grown by chemical vapor deposition*, 74 Appl. Phys. Lett., No. 17, pp. 2432-2434 (Apr. 26, 1999).

Streiffer et al., *Ferroelectricity in thin films: The dielectric response of fiber-textured $(Ba_xSr_{1-x})Ti_{1+y}O_{3+Z}$ thin films grown by chemical vapor deposition*, 86 J. Appl. Phys. No. 8, pp. 4565-4575 (Oct. 15, 1999).

Abstract: Takeuchi et al., *Effect of firing atmosphere on the cubic-hexagonal transition in $Ba_{0.99}Sr_{0.01}TiO_3$*, 98 Nippon Seramikkusu Kyokai Gaxujutus Ronbunshi, No. 8, pp. 836-839 (1990).

Abstract: Yamaguchi et al., *Reactive coevaporation synthesis and characterization of $SrTiO_3$- . . .* , IEEE International Symposium on Applications of Ferroelectrics, Greenville, SC, pp. 285-288 (Aug. 1992).

Abstract: Yamamichi et al., *Ba+Sr/Ti ratio dependence of the dielectric properties for $(Ba_{0.5}Sr_{0.5})TiO_3$ thin films prepared by ion beam sputtering*, 64 Appl. Phys. Lett., No. 13, pp. 1644-1646 (1994).

Abstract: Yamamuka et al., *Thermal-Desorption Spectroscopy of (Ba,Sr)$TiO_3$ thin-films prepared by Chemical-Vapor-Deposition*, 35 Jpn. J. of Appl. Phys., Pt. 1, No. 2A, pp. 729-735 (1996).

U.S. Appl. No. 09/388,063, filed Aug. 30, 1999, Agarwal et al.

U.S. Appl. No. 09/652,907, filed Aug. 31, 2000, Basceri et al.

U.S. Appl. No. 09/580,733, filed May 2000, Basceri.

* cited by examiner

US 7,488,514 B2

METHODS OF FORMING BARIUM STRONTIUM TITANATE LAYERS

RELATED PATENT DATA

This patent resulted from a continuation application of U.S. patent application Ser. No. 09/905,286, filed Jul. 13, 2001, which is now U.S Pat. No. 6,838,122.

TECHNICAL FIELD

This invention relates to chemical vapor deposition methods of forming barium strontium titanate comprising dielectric layers, including such layers having varied concentration of barium and strontium within the layer.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials (such as ferroelectric materials, perovskite materials and pentoxides) are commonly referred to as "high k" materials due to their high dielectric constants, which make them attractive as dielectric materials in capacitors, for example for high density DRAMs and non-volatile memories. Using such materials enables the creation of much smaller and simpler capacitor structures for a given stored charge requirement, enabling the packing density dictated by future circuit design. One such known material is barium strontium titanate.

SUMMARY

The invention comprises in one aspect a chemical vapor deposition method of forming a barium strontium titanate comprising dielectric layer. A substrate is positioned within a chemical vapor deposition reactor. Barium and strontium are provided within the reactor by flowing at least one metal organic precursor to the reactor. Titanium is provided within the reactor. At least one oxidizer is also flowed to the reactor under conditions effective to deposit a barium strontium titanate comprising dielectric layer on the substrate. In one implementation, the oxidizer comprises $H_2O$. In one implementation, the oxidizer comprises $H_2O_2$. In one implementation, the oxidizer comprises at least $H_2O$ and at least another oxidizer selected from the group consisting of $O_2$, $O_3$, $NO_x$, $N_2O$, and $H_2O_2$, where "x" is at least 1. In one implementation, the oxidizer comprises at least $H_2O_2$ and at least another oxidizer selected from the group consisting of $O_2$, $O_3$, $NO_x$, and $N_2O$, where "x" is at least 1.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
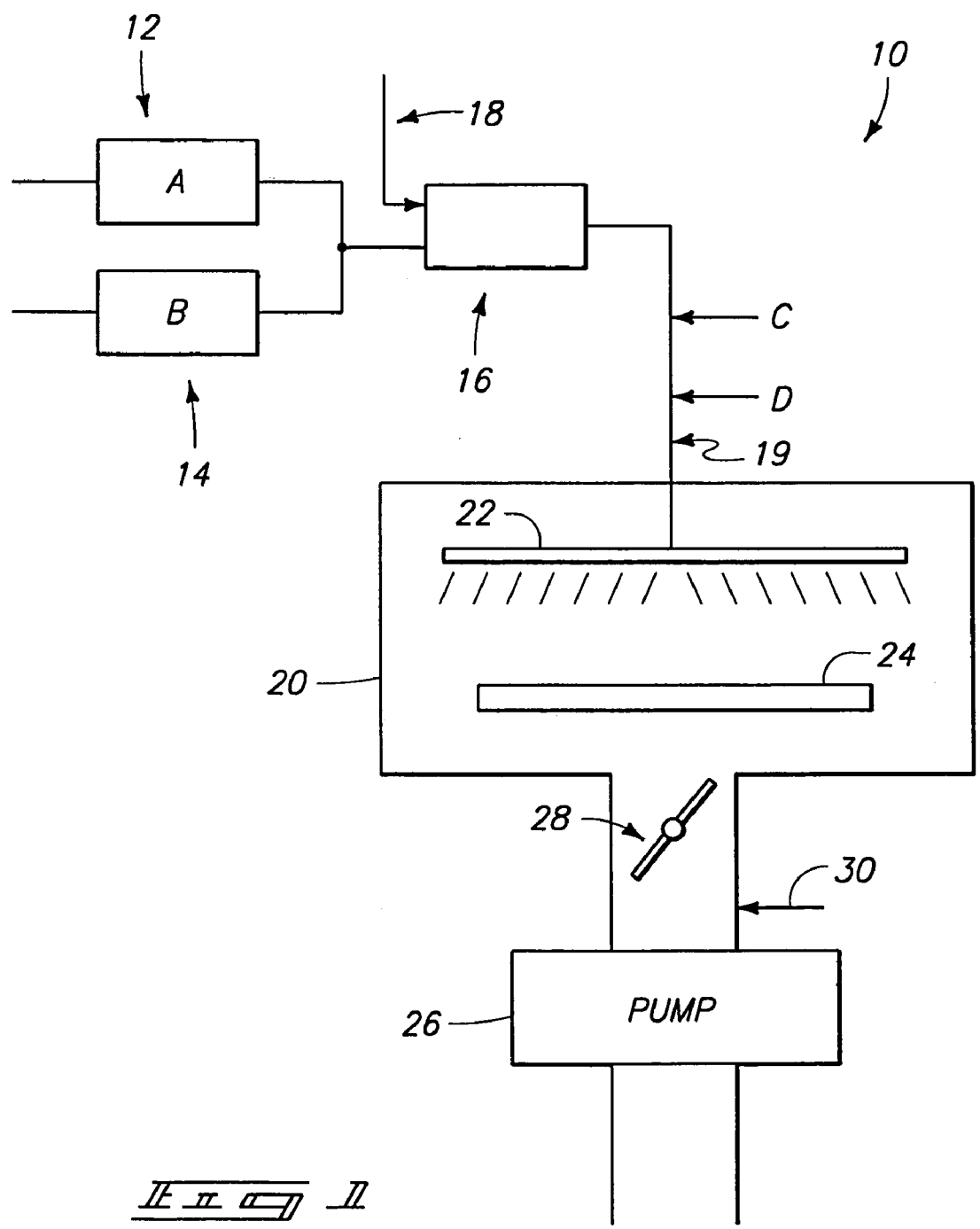
FIG. 1 is schematic diagram of an exemplary system usable in accordance with an aspect of the invention.

FIG. 1 diagrammatically illustrates but one chemical vapor deposition system 10 in accordance with but one implementation of a chemical vapor deposition method in accordance with an aspect of the invention. Such comprises an A precursor feed stream 12 and a B precursor feed stream 14. Such combine and feed to a vaporizer 16. An inert gas stream 18 can also be provided to vaporizer 16 to facilitate flow of the vaporized precursors to a downstream chamber.

A chemical vapor deposition chamber 20 is connected downstream of vaporizer 16. Such includes a showerhead 22 for receiving and distributing gaseous precursors therein. A suitable wafer holder 24 is received within chamber 20. Oxidizer gas feed streams, for example two oxidizer feed streams C and D, are preferably provided upstream of the showerhead. Further, an additional inert gas feed stream 19 is shown positioned between the oxidizer feed streams and chamber. More or less feed streams with or without mixing might also of course be utilized. The deposition is preferably conducted at subatmospheric pressure, with a vacuum pump 26 and an exemplary valve 28 being diagrammatically illustrated for achieving a desired vacuum pressure within chamber 20. Further, the deposition may or may not be plasma enhanced.

In one example, and by way of example only, the A stream consists essentially of a mixture of Ba and Sr precursors (i.e., preferably about 50%-50% by volume), and the B stream consists essentially of Ti precursor(s). Example preferred deposition is by metal organic chemical vapor deposition (MOCVD) processes, with at least one oxidizer being provided within chamber 20 with suitable MOCVD precursors to deposit a desired barium strontium titanate comprising dielectric layer. Example precursors, and by way of example only, include:

| | |
|---|---|
| $Ba(thd)_2$ | bis(tetramethylheptanedionate) |
| $Sr(thd)_2$ | bis(tetramethylheptanedionate) |
| $Ti(thd)_2(O\text{-}i\text{-}Pr)_2$ | (isopropoxide)bis(tetramethylheptanedionate) |
| $Ba(thd)_2$ | bis(tetramethylheptanedionate) |
| $Sr(thd)_2$ | bis(tetramethylheptanedionate) |
| $Ti(dmae)_4$ | bis(dimethylaminoethoxide) |
| $Ba(methd)_2$ | bis(methoxyethoxyte, tetramethylheptanedionate) |
| $Sr(methd)_2$ | bis(methoxyethoxyte, tetramethylheptanedionate) |
| $Ti(mpd)(thd)_2$ | bis(methylpentanediol, tetramethylheptanedionate) |

-continued

| | |
|---|---|
| Ba(dpm)$_2$ | bis(dipivaloylmethanato) |
| Sr(dpm)$_2$ | bis(dipivaloylmethanato) |
| TiO(dpm)$_2$ | (titanyl)bis(dipivaloylmethanato) |
| Ba(dpm)$_2$ | bis(dipivaloylmethanato) |
| Sr(dpm)$_2$ | bis(dipivaloylmethanato) |
| Ti(t-BuO)$_2$(dpm)$_2$ | (t-butoxy)bis(dipivaloylmethanato) |
| Ba(dpm)$_2$ | bis(dipivaloylmethanato) |
| Sr(dpm)$_2$ | bis(dipivaloylmethanato) |
| Ti(OCH$_3$)$_2$(dpm)$_2$ | (methoxy)bis(dipivaloylmethanato) |

Adducts (i.e., tetraglyme, trietherdiamine, pentamethyidiethlyenetriamine), solvents (i.e., butylacetate, methanol, tetrahydrofuran), and/or other materials might be utilized with the precursors. By way of example only, and where the precursors include metal organic precursors, example flow rates for the various of such precursors include anywhere from 10 mg/min. to 1000 mg/min. of liquid feed to any suitable vaporizer.

Figure 2:
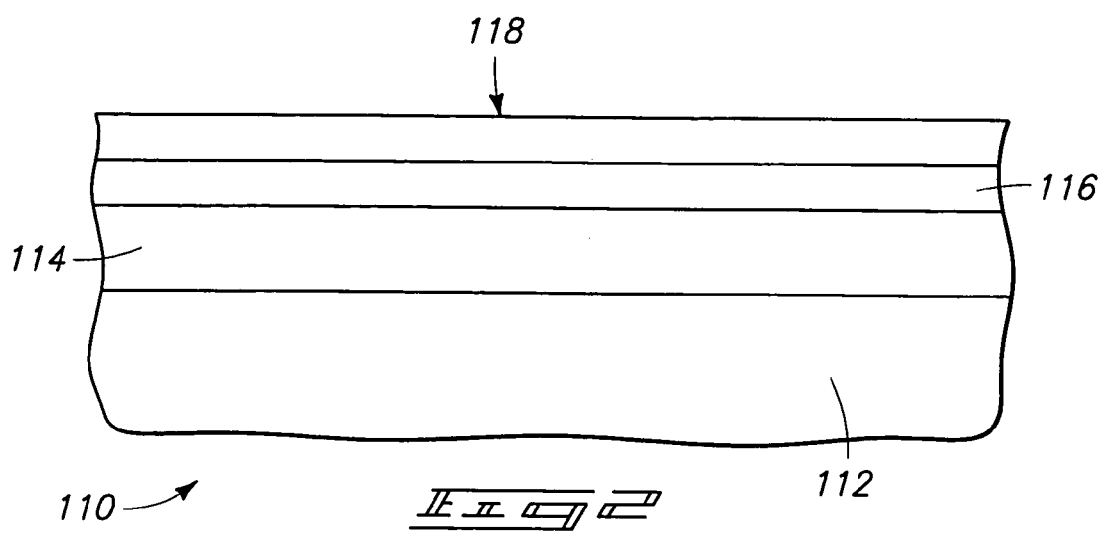
FIG. 2 a diagrammatic sectional view of a semiconductor wafer fragment in process in accordance with an aspect of the invention.

A first aspect of the invention is described in connection with a chemical vapor deposition method of forming a barium strontium titanate comprising dielectric layer having a varied concentration of barium and strontium within the layer. By way of example only, an exemplary implementation is described with reference to FIG. 2. FIG. 2 depicts an exemplary substrate 110 comprising a bulk monocrystalline silicon substrate 112. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. An insulative layer 114, such as borophosphosilicate glass (BPSG) by way of example only, is formed over substrate 112. A conductive capacitor electrode layer 116, such as platinum or an alloy thereof by way of example only, is formed over layer 114.

Such substrate is placed within a chemical vapor deposition reactor. Plasma, remote or within the chamber, might be utilized. Barium and strontium are provided within the reactor by flowing at least one metal organic precursor to the reactor. Titanium is also provided within the reactor. By way of example only, exemplary precursors are as described above. At least one oxidizer is also flowed to the reactor. Conditions are provided within the reactor effective to deposit a barium strontium titanate comprising dielectric layer 118 on the substrate. In one preferred embodiment, the barium and strontium are provided within the reactor by flowing at least two metal organic precursors to the reactor, with one of the precursors comprising barium, and another of the precursors comprising strontium. Such precursors might be fed to the reactor as separate flow streams, or as a mixture in a single flow stream, as depicted by FIG. 1 and described above with respect to stream 12.

In accordance with the invention, the oxidizer comprises at least one of H$_2$O or H$_2$O$_2$. Other oxidizers might also be utilized. In one aspect of the invention, the oxidizers comprise at least H$_2$O and at least another oxidizer selected from the group consisting of O$_2$, O$_3$, NO$_x$, N$_2$O, and H$_2$O$_2$, where "x" is at least 1. In one aspect of the invention, the oxidizers comprise at least H$_2$O$_2$ and at least another oxidizer selected from the group consisting of O$_2$, O$_3$, NO$_x$, and N$_2$O, where "x" is at least 1. Use of more than one of the another oxidizers is of course contemplated, as is use of additional oxidizers.

In the exemplary depicted FIG. 2 example, flow rate of the oxidizer(s) and flow rate of the metal organic precursor(s) are provided to the reactor under some suitable set of conditions effective to deposit a substantially homogenous barium strontium titanate layer 118.

Figure 3:
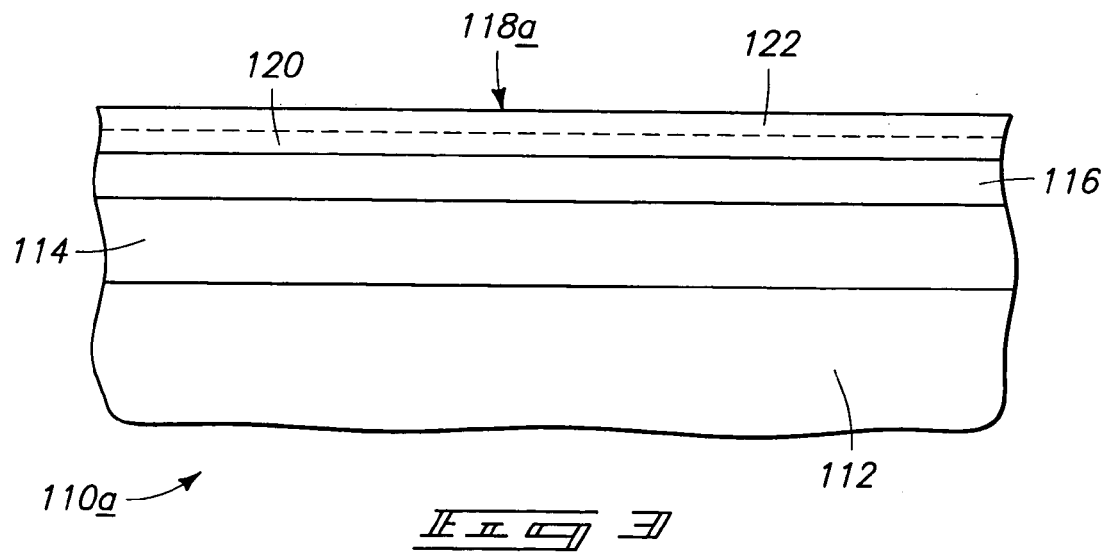
FIG. 3 is a diagrammatic sectional view of an alternate embodiment semiconductor wafer fragment in process in accordance with an aspect of the invention.

Alternate processing could of course be utilized. FIG. 3 illustrates an alternate embodiment wafer fragment 110a. Like numerals from the first described embodiment are utilized where appropriate, with differences being indicated with the suffix "a" or with different numerals. Some aspect of the rate of flow of the precursor or the oxidizer(s) (i.e., the rate of flow of one or more oxidizers to the reactor) is changed to affect a change in relative atomic concentration of barium and strontium, for example to deposit a substantially homogenous second portion 122 of barium strontium titanate layer 118a. Accordingly regions 120 and 122 of layer 18 while constituting barium strontium titanate have different relative atomic ratios of barium and strontium. Ratios of barium to strontium in the deposited layer might vary anywhere from 0.1% to 99% barium versus strontium.

Additional and/or alternate preferred processing can occur in accordance with any of our commonly assigned U.S. patent application Ser. No. 09/476,516, filed on Jan. 3, 2000, entitled "Chemical Vapor Deposition Methods Of Forming A High K Dielectric Layer And Methods Of Forming A Capacitor", listing Cem Basceri as inventor; U.S. patent application Ser. No. 09/580,733, filed on May 26, 2000, entitled "Chemical Vapor Deposition Methods And Physical Vapor Deposition Methods", listing Cem Basceri as inventor; and U.S. patent application Ser. No. 09/905,320, filed concurrently herewith, entitled "Chemical Vapor Deposition Methods Of Forming Barium Strontium Titanate Comprising Dielectric Layers, Including Such Layers Having A Varied Concentration Of Barium And Strontium Within The Layer", listing Cem Basceri and Nancy AIzola as inventors. Each of these is hereby fully incorporated by reference.

Preferred total flows of the oxidizers include anywhere from 100 sccm to 4000 sccm, more preferably between 500 sccm and 2000 sccm, and more preferably between 750 sccm and 1250 sccm. Such flow rates are with respect to an Applied Materials Centura Frame processor. A preferred pressure range is from 100 mTorr to 20 Torr, with a range of from 1 Torr to 6 Torr believed to be most preferred. Susceptor temperature is preferably from 100° C. to 700° C., more preferably from 400° C. to 700° C., with less than or equal to 550° C. being even more preferred, particularly in obtaining continuity in the deposited layer at a thickness at or below 200 Angstroms, and preferably at least down to 50 Angstroms. Most preferably, the susceptor temperature is kept at less than or equal to 550° C. during all of the deposit to form the subject layer. An inert gas, such as Ar, is also preferably flowed to the reactor downstream of the oxidizer feeds, and preferably at substantially the same flow rate as the total oxidizer flow rate.

It is expected that H$_2$O$_2$ would be a stronger oxidizer as compared to H$_2$O. Without being limited by any theory, it is expected that both H$_2$O and H$_2$O$_2$ will form OH$^-$ during deposition conditions for BST films. Although OH$^-$ will behave differently than other oxidizers (such as O$_3$, NO, O$_2$, and N$_2$O) in the presence of BST precursors, its effect is expected to mild and similar to N$_2$O. By way of example only, and not in any way by way of limitation, use of H$_2$O and/or H$_2$O$_2$ as sole oxidizers is expected to increase the atomic percent of titanium in the titanate, and reduce the deposition rate as compared to a 50:50 volumetric ratio control feed of O$_2$ and N$_2$O as oxidizers. Use of a) O$_2$ and, b) H$_2$O and/or $H_2O_2$ in combination in a 1:1 volumetric ratio is expected to decrease titanium incorporation in the titanate, and increase the deposition rate. Utilization of a) $O_3$ and, b) $H_2O$ and/or $H_2O_2$ is also expected to increase the titanium incorporation in the titanate, but reduce the deposition rate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A chemical vapor deposition method of forming a barium strontium titanate comprising dielectric layer, comprising:
   positioning a substrate within a chemical vapor deposition reactor;
   simultaneously a) providing gaseous barium and strontium within the reactor by flowing at least one metal organic precursor to the reactor, b) providing gaseous titanium within the reactor, and c) flowing gaseous oxidizers to the reactor under conditions effective to deposit a barium strontium titanate comprising dielectric layer on the substrate, the flowing gaseous oxidizers comprising flowing at least one oxidizer selected from the group consisting of $O_2$, $O_3$, $NO_x$, and $N_2O$, where "x" is at least 1, and flowing $H_2O$, the flowing the gaseous oxidizers having a total oxidizer flow rate;
   flowing an inert gas to the reactor at an inert gas flow rate that is substantially equivalent to the total oxidizer flow rate; and
   adjusting the amount of $H_2O$ to control an amount of titanate incorporated into the dielectric layer.

2. The method of claim 1 wherein the at least one oxidizer comprises $O_2$.

3. The method of claim 1 wherein the at least one oxidizer comprises $O_3$.

4. The method of claim 1 wherein the at least one oxidizer comprises $NO_x$, where "x" is at least 1.

5. The method of claim 1 wherein the at least one oxidizer comprises $N_2O$.

6. The method of claim 1 wherein the gaseous oxidizers additionally include $H_2O_2$.

7. The method of claim 1 wherein the at least one oxidizer is two oxidizers.

8. A method of method of forming a barium strontium titanate comprising dielectric layer, comprising:
   providing a substrate within a reactor;
   flowing at least one barium strontium titanate precursor into the reactor;
   flowing at least one oxidizer selected from the group consisting of of $H_2O$ and $H_2O_2$ into the reactor; the flowing the at least one oxidizer producing a total oxidizer flow rate;
   flowing an inert gas into the reactor at an inert gas flow rate substantially equivalent to the total oxidizer flow rate; and
   depositing a barium strontium titanate layer; and
   during the depositing, adjusting the flow rate of the at least one of $H_2O$ and $H_2O_2$ to produce a non-homogenous ratio of barium relative to strontium within the layer.

9. The method of claim 8 wherein the adjusting additionally changes an atomic percent of titanium within the titanate deposited within the layer.

10. The method of claim 8 wherein the substrate comprises a conductive electrode layer and wherein the barium strontium titanate layer is deposited on the conductive electrode layer.

11. The method of claim 10 wherein the conductive electrode layer comprises platinum.

12. The method of claim 8 wherein the flowing the at least one oxidizer further comprises flowing an additional oxidizer into the reactor during the depositing.

13. A method of forming a semiconductor construction, comprising:
   providing a semiconductor substrate;
   forming an insulative layer comprising borophosphosilicate glass over the substrate;
   forming a conductive capacitor electrode layer over the insulative layer; and
   depositing a barium strontium titanate-comprising dielectric layer over the conductive capacitor electrode layer, the depositing comprising:
      positioning the substrate within a chemical vapor deposition reactor;
      simultaneously a) providing gaseous barium and strontium within the reactor, b) providing gaseous titanium within the reactor, and C) flowing at least one gaseous oxidizer comprising $H_2O$ to the reactor under conditions effective to deposit a barium strontium titanate comprising dielectric layer on the substrate; and
      during the flowing at least one gaseous oxidizer, changing the flow rate of one or more oxidizers to produce a non-homogenous ratio of barium relative to strontium within the dielectric layer.

14. The method of claim 13 wherein the conductive capacitor electrode layer comprises platinum.

15. The method of claim 13 wherein the rate of flowing $H_2O$ is adjusted during the depositing.

16. The method of claim 13 wherein the changing the flow rate additionally changes an atomic percent of titanium within the titanate deposited within the layer.

17. The method of claim 13 wherein the conditions comprise receipt of the substrate by a susceptor having a temperature of less than or equal to 550° C.

18. A method of method of forming a barium strontium titanate comprising dielectric layer, comprising:
   providing a semiconductor substrate within a reactor;
   flowing at least one barium strontium titanate precursor selected from the group consisting of Ba(thd)$_2$-bis(tetramethylheptanedionate), Sr(thd)$_2$-bis(tetramethylheptanedionate), Ti(thd)$_2$(O-i-Pr)$_2$-(isopropoxide)bis(tetramethylheptanedionate), Ba(thd)$_2$-bis(tetramethylheptanedionate), Sr(thd)$_2$-bis(tetramethylheptanedionate), Ti(dmae)$_4$-bis(dimethylam inoethoxide), Ba(methd)$_2$-bis(methoxyethoxyte,tetramethylheptanedionate), Sr(methd)$_2$-bis(methoxyethoxyte, tetramethylheptanedionate), Ti(mpd) (thd)$_2$-bis(methylpentanediol, tetramethylheptanedionate), Ba(dpm)$_2$-bis(dipivaloylmethanato), Sr(dpm)$_2$-bis(dipivaloylmethanato), TiO(dpm)$_2$-(titanyl)bis(dipivaloylmethanato), Ba(dpm)$_2$-bis(dipivaloylmethanato), Sr(dpm)$_2$-(dipivaloylmethanato), Ti(t-BuO)$_2$(dpm)$_2$-(t-butoxy)bis(dipivaloylmethanato), Ba(dpm)$_2$-bis(dipivaloylmethanato), Sr(dpm)$_2$-bis(dipivaloylmethanato), and Ti(OCH$_3$)$_2$(dpm)$_2$-(methoxy)bis(dipivaloylmethanato) into the reactor;
   flowing oxidizer into the reactor at a total oxidizer flow rate, the flowing oxidizer comprising flowing at least one of $H_2O$ and $H_2O_2$ into the reactor;

flowing an inert gas into the reactor at an inert gas flow rate substantially equivalent to the total oxidizer flow rate;

depositing a barium strontium titanate layer; and during the depositing, adjusting the flow rate of the at least one of $H_2O$ and $H_2O_2$ to produce a non-homogenous ratio of barium relative to strontium within the layer.

19. The method of claim 18 wherein the flow rate of $H_2O$ is adjusted during the depositing.

20. The method of claim 18 wherein the flow rate of the $H_2O_2$ is adjusted during the depositing.

21. The method of claim 18 wherein the flow rates of both the $H_2O$ and the $H_2O_2$ are adjusted during the deposition.

22. The method of claim 18 wherein an adduct is utilized with the precursor.

23. The method of claim 22 wherein the adduct is selected from the group consisting of tetraglyme, trietherdiamine, and pentamethyldiethlyenetriamine.

24. The method of claim 18 wherein a solvent is utilized with the precursor.

25. The method of claim 24 wherein the solvent is selected from the group consisting of butylacetate, methanol, and tetrahydrofuran.

* * * * *

UNITED STATES PATENT AND TRADEMARK OFFICE
CERTIFICATE OF CORRECTION

PATENT NO. : 7,488,514 B2  Page 1 of 1
APPLICATION NO. : 11/028956
DATED : February 10, 2009
INVENTOR(S) : Basceri et al.

It is certified that error appears in the above-identified patent and that said Letters Patent is hereby corrected as shown below:

In column 5, line 55, in Claim 8, after "of" delete "of".

In column 5, line 55, in Claim 8, delete "reactor;" and insert -- reactor, --, therefor.

In column 6, line 17, in Claim 13, delete "titanate-comprising" and insert -- titanate comprising --, therefor.

In column 6, line 24, in Claim 13, delete "C)" and insert -- c) --, therefor.

In column 6, line 52, in Claim 18, delete "(dimethylam inoethoxide)," and insert -- (dimethylaminoethoxide), --, therefor.

In column 6, line 53, in Claim 18, delete "(methoxyethoxyte,tetramethylheptanedionate)," and insert -- (methoxyethoxyte, tetramethylheptanedionate), --, therefor.

In column 8, line 5, in Claim 23, delete "pentamethyldiethlyenetriamine." and insert -- pentamethyldiethylenetriamine. --, therefor.

Signed and Sealed this

Twenty-first Day of April, 2009

JOHN DOLL
*Acting Director of the United States Patent and Trademark Office*